(12) United States Patent
Hughes et al.

(10) Patent No.: US 8,362,769 B2
(45) Date of Patent: Jan. 29, 2013

(54) MAGNETIC RESONANCE METHOD AND DEVICE TO AUTOMATICALLY DIFFERENTIATE WATER-DOMINATED AND FAT-DOMINATED TISSUE WITH ONLY ONE SPIN ECHO ACQUIRED FOR EACH PIXEL

(75) Inventors: Timothy Hughes, Erlangen (DE); Vladimir Jellus, Erlangen (DE); Michael Szimtenings, Bonn (DE)

(73) Assignee: Siemens Aktiengesellschaft, Munich (DE)

( * ) Notice: Subject to any disclaimer, the term of this patent is extended or adjusted under 35 U.S.C. 154(b) by 555 days.

(21) Appl. No.: 12/564,272

(22) Filed: Sep. 22, 2009

(65) Prior Publication Data

US 2010/0072998 A1    Mar. 25, 2010

(30) Foreign Application Priority Data

Sep. 22, 2008   (DE) .......................... 10 2008 048 304

(51) Int. Cl.
*G01V 3/00* (2006.01)
(52) U.S. Cl. ........................................ 324/307; 324/309
(58) Field of Classification Search .......... 324/300–322; 600/407–435; 382/128–131
See application file for complete search history.

(56) References Cited

U.S. PATENT DOCUMENTS

| | | | | |
|---|---|---|---|---|
| 4,714,885 A * | 12/1987 | Paltiel et al. | ................... | 324/312 |
| 4,720,679 A * | 1/1988 | Patrick et al. | ................... | 324/309 |
| 4,871,967 A * | 10/1989 | Rotem et al. | ................... | 324/309 |
| 5,187,439 A * | 2/1993 | Jensen et al. | ................... | 324/309 |
| 5,245,282 A * | 9/1993 | Mugler et al. | ................. | 324/309 |
| 6,016,057 A * | 1/2000 | Ma | ................. | 324/309 |
| 6,091,243 A * | 7/2000 | Xiang et al. | ................... | 324/309 |
| 6,147,492 A * | 11/2000 | Zhang et al. | ................... | 324/309 |
| 6,597,172 B2 | 7/2003 | Miyoshi | ........................ | 324/307 |
| 7,141,972 B2 * | 11/2006 | Avram et al. | ................. | 324/309 |
| 7,164,268 B2 * | 1/2007 | Mugler et al. | ................. | 324/309 |
| 7,196,518 B2 * | 3/2007 | Yatsui et al. | ................... | 324/309 |
| 7,227,359 B2 * | 6/2007 | Ma | ................. | 324/307 |
| 7,821,266 B2 * | 10/2010 | Feiweier | ...................... | 324/309 |
| 7,863,895 B2 * | 1/2011 | Ma | ................. | 324/309 |
| 8,040,134 B2 * | 10/2011 | Abe et al. | ...................... | 324/309 |

(Continued)

OTHER PUBLICATIONS

"Generalized k-space Decomposition with Chemical Shift Correction for Non-Cartesian Water-Fat Imaging," Brodsky et al., Magnetic Resonance in Medicine, vol. 58 (2008) pp. 1151-1164.
"Breath-Hold Water and Fat Imaging Using a Dual0Echo Two-Point Dixon Technique With an Efficient and Robust Phase-Correction Algorithm," Jingfei Ma, Magnetic Resonance in Medicine, vol. 52 (2004) pp. 415-419.

*Primary Examiner* — Melissa Koval
*Assistant Examiner* — Tiffany Fetzner
(74) *Attorney, Agent, or Firm* — Schiff Hardin LLP

(57) ABSTRACT

In a magnetic resonance method and system to automatically differentiate whether a pixel of an MR image acquired with magnetic resonance system originated from fat-dominated tissue or water-dominated tissue, only one spin echo-based magnetic resonance signal per pixel is acquired at a point in time at which the phase of a magnetic resonance signal of aqueous tissue has a phase opposite to the phase of a magnetic resonance signal of fat tissue. The phase angle of the pixel is then calculated, a base phase at the pixel depending on the magnetic resonance system is determined, and a corrected phase angle of the pixel is determined from the phase angle and the base phase. Whether the pixel originated from fat-dominated tissue or water-dominated tissue is then determined using the corrected phase angle of the pixel.

14 Claims, 3 Drawing Sheets

U.S. PATENT DOCUMENTS

| | | |
|---|---|---|
| 2003/0067300 A1 | 4/2003 | Miyoshi ........................ 324/309 |
| 2004/0010191 A1* | 1/2004 | Yatsui ........................... 600/410 |
| 2004/0051527 A1* | 3/2004 | Mugler, III et al. ........... 324/309 |
| 2005/0168221 A1 | 8/2005 | Miyoshi ........................ 324/309 |
| 2009/0033328 A1* | 2/2009 | Feiweier ....................... 324/309 |
| 2009/0093704 A1* | 4/2009 | Ma ................................ 324/309 |
| 2009/0201021 A1 | 8/2009 | Jellus ............................ 324/309 |
| 2010/0072998 A1* | 3/2010 | Hughes et al. ................ 324/309 |
| 2010/0195885 A1* | 8/2010 | Ma ................................ 382/131 |
| 2010/0244830 A1* | 9/2010 | Geppert et al. ................ 324/309 |

* cited by examiner

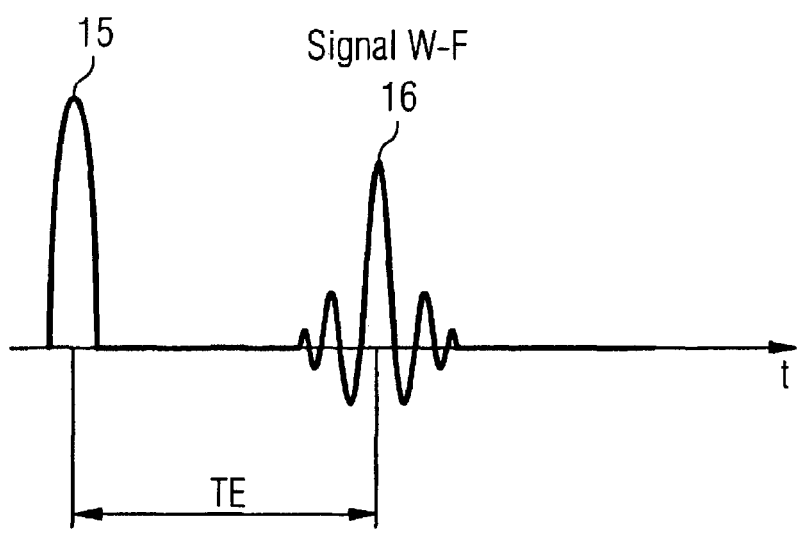

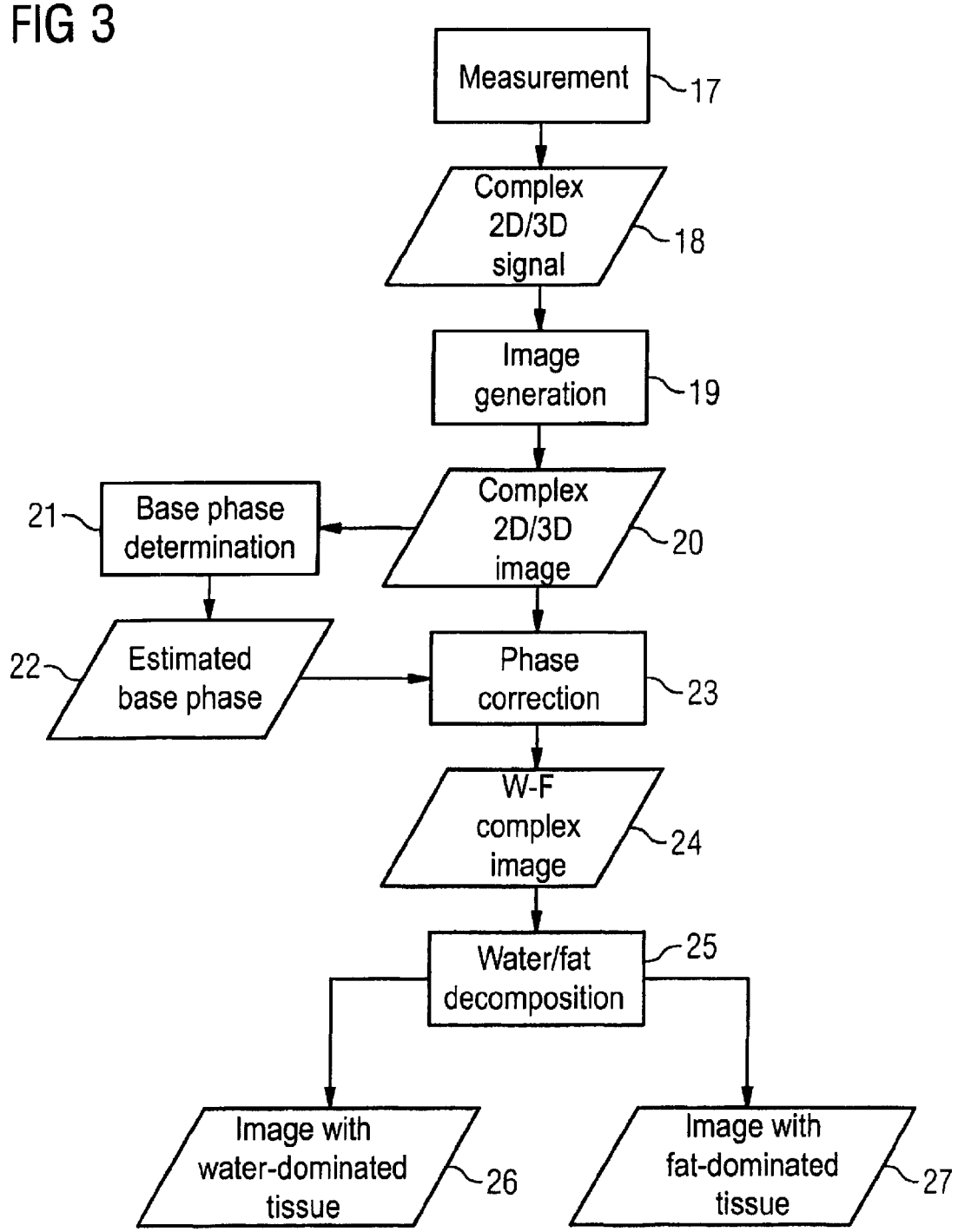

MAGNETIC RESONANCE METHOD AND DEVICE TO AUTOMATICALLY DIFFERENTIATE WATER-DOMINATED AND FAT-DOMINATED TISSUE WITH ONLY ONE SPIN ECHO ACQUIRED FOR EACH PIXEL

BACKGROUND OF THE INVENTION

1. Field of the Invention

The present invention concerns a method to automatically differentiate whether a pixel of a magnetic resonance image (acquired with a magnetic resonance system) originated from a fat-dominated tissue or water-dominated tissue, as well as a corresponding magnetic resonance system to differentiate whether a pixel of an MR image (acquired with the magnetic resonance system) originated from fat-dominated tissue or water-dominated tissue.

2. Description of the Prior Art

Imaging by magnetic resonance, i.e. magnetic resonance tomography (MR tomography) has ever-increasing fields of application in medical diagnostics. There are many applications of magnetic resonance tomography in which it is desired to differentiate tissue types that have a water-dominated content or fat-dominated content. For example, to determine damping maps for MR/PET systems it is necessary to segment tissue containing water and fat. Such a differentiation can also be usable in a combined MR and PET system (for example in a damping correction) or, for example, can be used in applications that have fat quantity determination or fat signal suppression.

The magnitude of the MR signal and the phase (i.e. the direction of the magnetization vector) that corresponds to the signal that exists for every pixel in an MR image. In conventional methods to differentiate water-dominated and fat-dominated tissues, it is typical to detect two (or more) magnetic resonance signals per pixel. In such methods (known as two-point Dixon techniques or the like, for example), for each pixel, one magnetic resonance signal is acquired in which the phase of the magnetic resonance signal of aqueous tissue exhibits the same phase as a magnetic resonance signal of fat tissue, and another magnetic resonance signal is acquired in which the phase of the magnetic resonance signal of the aqueous tissue is opposite the phase of the magnetic resonance signal of fat tissue. With the use of the two magnetic resonance signals per pixel, it is then possible to differentiate between water-dominated and fat-dominated tissue. However, this method requires a relatively large time duration since at least two spin echo-based magnetic resonance signals (one in phase and one in opposite phase) must be detected per pixel. The use of this technique is therefore not feasible in many cases. Additional approaches attempt to use a histogram-based fat/water separation together with imaging protocols that create significant differences in the signal intensities of fat-dominated and water-dominated tissues. However, these methods are not very stable, in particular if the entire body is examined and acquisition coils with inhomogeneous sensitivity are thereby used.

SUMMARY OF THE INVENTION

An object of the present invention is to provide a simple method to automatically differentiate whether a pixel of a magnetic resonance image acquired with a magnetic resonance system originated from a fat-dominated tissue or a water-dominated tissue.

According to the present invention, a method to automatically differentiate whether a pixel of a magnetic resonance image (MR image) acquired with a magnetic resonance system originated from a fat-dominated tissue or from water-dominated tissue includes the following steps. An MR image is first acquired in which only one spin echo-based magnetic resonance signal is detected per pixel. The magnetic resonance signal is acquired at a point in time at which a phase of a magnetic resonance signal of aqueous tissue has a phase opposite to a phase of a magnetic resonance signal of fat tissue. Suitable methods for the acquisition of magnetic resonance signals in which magnetic resonance signals of fat tissue and aqueous tissue have an opposite phase are known from the two-point Dixon method, for example. A phase angle of the magnetic resonance signal is then calculated for every pixel to be examined. Furthermore, a system-dependent base phase is determined for every pixel. A corrected phase angle for the pixel is then calculated from the phase angle of the pixel and the base phase at the pixel. Using the corrected phase angle of the pixel, it is then determined whether the pixel belongs to (originated from) a fat-dominated tissue or a water-dominated tissue.

With this method, it is possible to differentiate water-dominated and fat-dominated tissue of an MR image, and only one spin echo-based magnetic resonance signal has to be detected for each pixel of the image. The method thus represents a reliable and fast imaging technique to differentiate water-dominated and fat-dominated tissues. Compared with the known two-point Dixon method, the method described herein requires only one echo with a typically short echo time, since the echo with opposite phase is detected as the first of the equiphase and counter-phase echoes. The echo time is approximately 2.4 ms in 1.5 T systems and 1.2 ms in 3T systems. Since the determination of whether a pixel belongs to a fat-dominated or water-dominated tissue is based on the corrected phase angle, the method is independent of inhomogeneous sensitivities of the acquisition coils. With the method described herein it is not possible to quantify a water proportion and a fat proportion in tissues which contain both water and fat, but this is not necessary in many applications. Given an application of this method in an MR-based damping map calculation, the differentiation of whether a pixel belongs to fat-dominated tissue or water-dominated tissue is used in order to associate damping coefficients of fat or muscle mass with the pixels, so the PET image quality (for example) is distinctly improved.

According to one embodiment, the system-dependent base phase at the pixel is determined using the following fact. In an ideal case, in the detection described in the preceding the phase angle of a magnetic resonance signal at a pixel amounts to either nearly 0° in water-dominated tissue or nearly 180° in fat-dominated tissue. Due to the system-dependent base phase at the pixel (which arises due to system inhomogeneities, for example), the phase angle of a pixel is additionally rotated by this base phase angle at the pixel. The base phase at the pixel can thereby have only either the value of the phase angle of the pixel or the value of the phase angle of the pixel plus 180°. The base phase at the pixel is accordingly determined in that either the value of the phase angle of the pixel or the value of the phase angle of the pixel plus 180° is associated with the base phase.

Either the value of the phase angle of the pixel or the value of the phase angle of the pixel plus 180° can be arbitrarily associated with a base phase at a pixel of the MR image, and either a value of the phase angle of the additional pixel or the value of the phase angle of the additional pixel plus 180° can then be associated with all additional base phases at further pixels of the MR image under consideration of the following fact. Due to the locally slowly changing system inhomogeneities, the difference between the system-dependent base phase at one point and an additional base phase at another point in the surroundings of the first point is only slight. The phase angles of adjacent pixels thus change only slightly as long as the adjacent pixels are either all water-dominated or all fat-dominated. By contrast, if adjacent pixels or pixels in closer surroundings belong to different tissue types (i.e. a first pixel belongs to a fat-dominated tissue, for example, and a second pixel belongs to a water-dominated tissue), the phase angles of the first pixel and the second pixel differ by nearly 180°.

The base phase for the pixels whose phase difference is either nearly 0° or nearly 180° can advantageously be determined first. At these pixels the probability that an incorrect base phase is associated is lowest. Less clear pixels can then be examined and their base phases can be determined, and at the end pixels can be examined whose phase difference is nearly 90°. Furthermore, it is advantageous to first examine pixels with a high signal level and to examine pixels with low signal level at the end, since pixels with low signal level have a large noise component.

In the further course of the method, the base phase of a pixel can be determined by forming the phase difference from the difference between the phase angle of the pixel to be determined and the phase angle of a vector sum of multiple pixels in proximity to the pixel in question, for which corresponding base phases have already been determined. The multiple pixels in proximity to the pixel in question can be, for example, multiple pixels from a spatial environment of 7×7×7 pixels around the pixel to be determined. The phase angle of the vector sum results by vector addition of the pixels, and the base phase previously determined for the respective pixel is respectively used as the phase angle of these pixels. If the phase difference is less than 90°, the value of the phase angle of the pixel is associated with the base phase at the pixel, and if the phase difference is greater than 90°, the value of the phase angle of the pixel plus 180° is associated with the base phase at the pixel. After the base phase for the pixel has been determined in this manner, the pixel can then be used to determine the base phases of additional pixels (for example as part of a corresponding vector sum).

Starting from an arbitrarily established base phase for one pixel, the base phase for all additional pixels can thus be determined with the aid of the method described in the preceding.

The method described above to determine the base phase at a pixel represents a specific embodiment of what is known as a region growing algorithm. As an alternative to the method described above in which the base phase is determined at a pixel depending on the base phase at an additional pixel an the phase angle of the pixel, the determination of the base phase at the pixel can be implemented with the use of additional known region growing algorithms. For example, an arbitrary region growing algorithm can be applied such that either a first region or a second region is associated with each pixel of the MR image using the phase angle of the pixels. The value of the phase angle of the pixel is then associated with the base phase at a pixel when the pixel is associated with the first region; in contrast to this, the value of the pixel plus 180° is associated with the base phase at the pixel if the pixel is associated with the second region.

The phase angles of each pixel and the base phase at each pixel are now known with the method described in the preceding. By subtraction of the base phase at the pixel from the phase angle of the pixel, a corrected phase angle can now be calculated for each pixel. The corrected phase angle of each pixel is now either 0° or 180°. A tissue type can now be associated with every pixel using the corrected phase angle. For example, all pixels with a corrected phase angle of 0° can thus be associated with a first tissue type and all pixels with a corrected phase angle of 180° can be associated with a second tissue type. One of the tissue types thereby pertains to fat-dominated tissue and the other tissue type pertains to water-dominated tissue. Depending on the previously described arbitrary association of either the phase angle or the phase angle plus 180° with the base phase, the first tissue can be fat-dominated tissue and the second tissue can be water-dominated tissue, or vice versa.

According to another embodiment of the method, the association of the two tissue types with water-dominated tissue or fat-dominated tissue can be implemented using properties of the pixels that are associated with the first tissue type, or the second tissue type. For example, a first average value of the magnitude of the pixels that are associated with the first tissue type and a second average value of the magnitudes of the pixels that are associated with the second tissue type can be determined. Since magnetic resonance signals from fat-dominated tissue are generally stronger than magnetic resonance signals from water-dominated tissue, the tissue type that exhibits the higher average value can be defined as fat-dominated tissue and the tissue type which exhibits the lower average value can be defined as water-dominated tissue. Alternatively, the two tissue types can also be associated with the water-dominated or fat-dominated tissue by a pixel coordinate being determined that belongs to water-dominated tissue. If the pixel at the determined pixel coordinate is associated with the first tissue type, the first tissue type is associated with the water-dominated tissue and the second tissue type is associated with the fat-dominated tissue. By contrast, if the pixel at the determined pixel coordinate is associated with the second tissue type, the first tissue type is associated with the fat-dominated tissue and the second tissue type is associated with the water-dominated tissue. Alternatively, a pixel coordinate can naturally also be determined that belongs to a fat-dominated tissue, and from this the first and the second tissue types are accordingly associated with the water-dominated or fat-dominated tissue. The determination of the pixel coordinate that belongs to the water-dominated or fat-dominated tissue can be input manually by a physician or those in the art, for example, or can be implemented automatically with the use of prior anatomical knowledge.

According to a further embodiment of the present invention for every pixel of the MR image it is determined whether the pixel belongs to a fat-dominated or water-dominated tissue, and with this determination an MR image is created which shows only water-dominated tissue. If a pixel belongs to the water-dominated tissue, the magnitude of this pixel is associated with a corresponding pixel in the MR image with water-dominated tissue. If the pixel does not belong to water-dominated tissue, a value of 0 is associated with the corresponding pixel in the MR image with water-dominated tissue. An MR image with fat-dominated tissue can be created in the same manner. If a pixel belongs to the fat-dominated tissue, the magnitude of this pixel is associated with a corresponding pixel in the MR image with fat-dominated tissue. Otherwise (i.e. if the pixel does not belong to the fat-dominated tissue), a value of 0 is associated with the corresponding pixel in the MR image with fat-dominated tissue.

Respective separate MR images for fat-dominated tissue and water-dominated tissue can be provided in a simple manner and with short measurement times in this way, since only one spin echo-based magnetic resonance signal must be acquired per pixel.

According to the present invention, a magnetic resonance system is furthermore provided to differentiate whether a pixel of an MR image acquired with the aid of the magnetic resonance system belongs to (originates from) fat-dominated tissue or water-dominated tissue. The magnetic resonance system has a control unit that controls a scanner (MR data acquisition unit), a receiver device that receives signals acquired by the scanner, and an evaluation device that evaluates the signals and generates an MR image. The magnetic resonance system is designed to acquire only one spin echo-based magnetic resonance signal per pixel. The magnetic resonance system is designed to acquire the magnetic resonance signal at a point in time at which a phase of the magnetic resonance signal of aqueous tissue exhibits a phase opposite a phase of a magnetic resonance signal of fat tissue. Furthermore, the magnetic resonance system is designed to calculate a phase angle of the magnetic resonance signal of the pixel and determine a base phase at the pixel that is due to the scanner. The magnetic resonance system then determines a corrected phase angle of the pixel from the phase angle of the pixel and the base phase at the pixel. Using the corrected phase angle of the pixel, the magnetic resonance system then determines whether the pixel belongs to fat-dominated tissue or water-dominated tissue. In further embodiments, the magnetic resonance system is designed such that it is suitable to implement other embodiments of the method described in the preceding.

The present invention also discloses an electronically readable data medium (for example a CD or DVD) on which electronically readable control information (programming instructions) are stored, in particular software. When loaded into a memory of a controller of a magnetic resonance system, the control information causes the system to operate as described above. All embodiments of the method according to the invention that have been described in the preceding can be implemented with the magnetic resonance system when this control information is read from the data medium and stored in a processing unit of the magnetic resonance system.

BRIEF DESCRIPTION OF THE DRAWINGS

FIG. 2 schematically shows a spin echo pulse series to detect a spin echo-based magnetic resonance signal according to an embodiment of the present invention.

FIG. 3 shows a flowchart of a method to generate a magnetic resonance image with fat-dominated tissue and a magnetic resonance image with water-dominated tissue according to an embodiment of the present invention.

DESCRIPTION OF THE PREFERRED EMBODIMENTS

Figure 1:
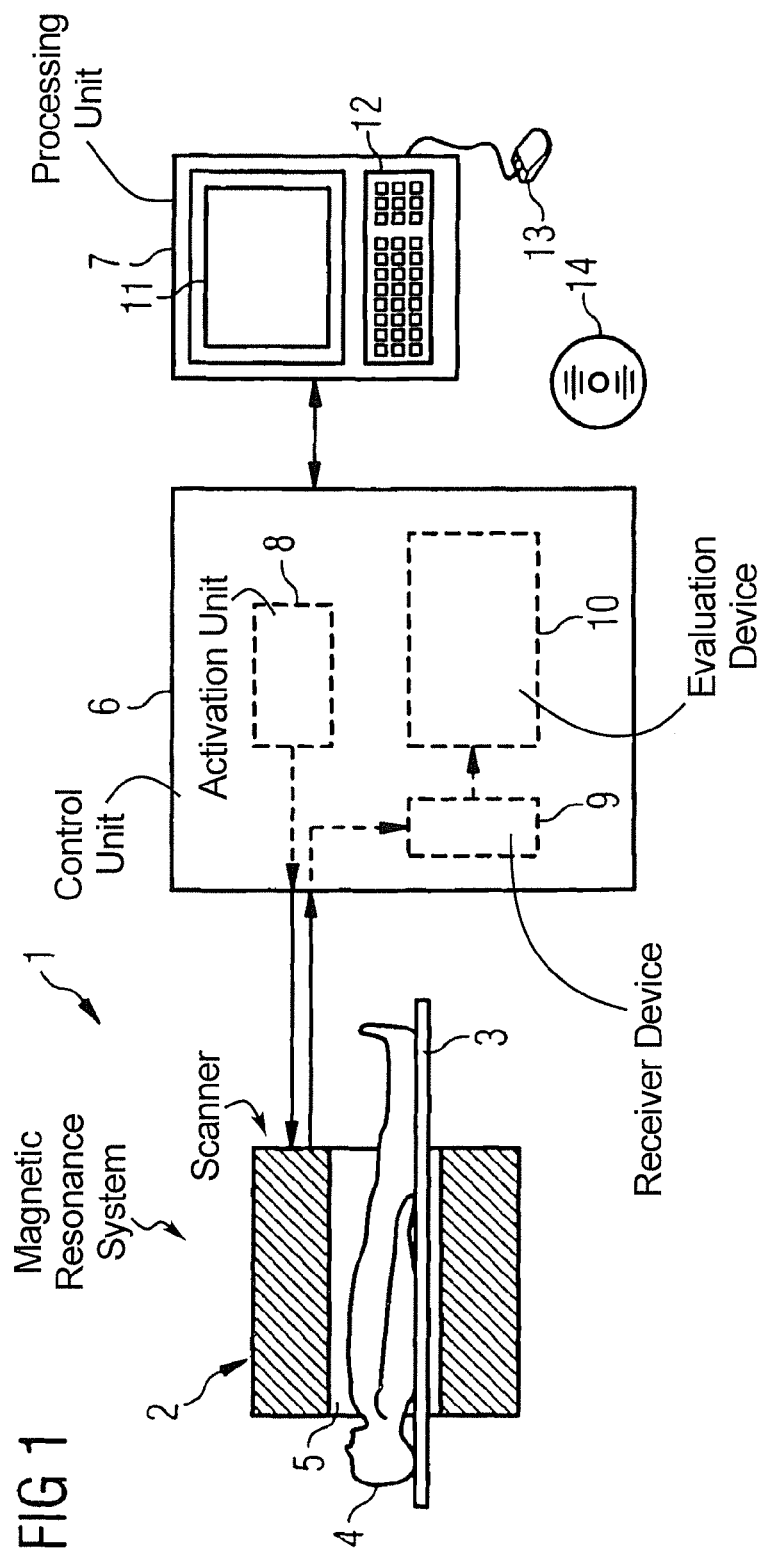
FIG. 1 schematically shows a magnetic resonance system according to an embodiment of the present invention.

FIG. 1 shows a magnetic resonance system 1 that includes scanner 2, a support device 3 for the patient 4 which is located in an opening 5 of the scanner 2, a control unit 6 and a processing unit 7. The control unit 6 has an activation unit 8 to control the scanner 2, a receiver device 9 to receive signals which have been acquired by the scanner 2, and an evaluation device 10 to evaluate the signals acquired by the scanner 2 and to generate a magnetic resonance image (MR image). The processing unit 7 is, for example, a computer system with a screen 11, a keyboard 12, a pointer input device (for example a mouse) 13 and a data medium 14 on which electronically readable control information is stored, which control information is designed such that it implements the method described in the following upon use of the data medium 14 in the processing unit 7.

In the scanner 2, multiple coils (not shown) generate a temporally constant magnetic field to polarize the atomic nuclei in the patient 4 to be examined. These coils surround a cylindrical hollow space 5 into which the patient 4 to be examined is inserted for a magnetic resonance measurement. A gradient coil (not shown) is inserted into this hollow space and has (for example) three sub-windings that generate respective gradient fields that are spatially perpendicular to one another and are proportional to the respectively injected currents. The sub-windings of the gradient coil are activated by the activation unit 8. A radio-frequency coil (not shown) is located inside the gradient coil. The radio-frequency coil has the task of converting RF pulses emitted by a power emitter of the activation unit 8 into an alternating field to excite the atomic nuclei, and to subsequently convert the alternating field emanating from the precessing nuclear moments into a voltage that is processed by the receiver device 9 and the evaluation device 10 to generate image information.

FIG. 2 shows a portion of a spin echo pulse series to detect a spin echo-based magnetic resonance signal for the method for automatic differentiation of whether a pixel of an MR image acquired with the aid of the magnetic resonance system 1 belongs to fat-dominated tissue or water-dominated tissue. After the emission of an RF pulse 15, only one echo signal 16 is acquired after a predetermined time TE. The echo time TE is selected so that one spin echo-based magnetic resonance signal in which a phase of a magnetic resonance signal of an aqueous tissue exhibits a phase opposite a phase of a magnetic resonance signal of an adipose tissue is detected per pixel of the MR image with the echo signal 16.

FIG. 3 shows, in the form of a flowchart, how a decomposition of the MR image into an image with water-dominated tissue and an image with fat-dominated tissue is implemented from the previously shown acquisition of the magnetic resonance signal for every pixel of an MR image. In the flowchart shown in FIG. 3, procedures (for example an acquisition process or a calculation process) are represented in rectangular blocks and data (which have been determined in a process or which are used by a process for determination) are represented in parallelogram-shaped blocks.

In a first Step 17, an MR image is acquired as described in the preceding with the aid of only one spin echo-based magnetic resonance signal per pixel. Depending on whether a 2D or 3D measurement is conducted, the acquisition or measurement in Step 17 yields a complex 2D or 3D signal in what is known as k-space, as shown in Block 18. An MR image is generated in Step 19 with the aid of the evaluation device 10 of FIG. 1. The result of the MR image generation of Step 19 is a complex 2D or 3D image as shown in Block 20. Every pixel B(x, y, z) of the complex 2D or 3D MR image comprises a real part and an imaginary part. Every pixel B(x, y, z) at a spatial point x, y, z consists of a water portion W(x, y, z) and a fat portion F(x, y, z) at the spatial point of the pixel. Since the acquisition point in time of the MR image is selected such that the phase of the magnetic resonance signal of an aqueous tissue exhibits a phase opposite a phase of the magnetic resonance signal of an adipose tissue, in the ideal case the pixel B would be equal to the difference of water content and fat content, i.e. B=(W−F). In this idea case, whether the pixel contains more water signal than fat signal (water-dominated tissue) or more fat signal than water signal (fat-dominated tissue) can be decided on the basis of the algebraic sign. The signal for the pixel is phase-shifted by $\psi$ due to system inadequacies such as (for example), magnetic field inhomogeneities, a static phase due to a radio-frequency penetration or a signal delay in the receiver device 12. It thus results for the pixel B that:

$$B = (W-F)e^{j\psi} \quad (1)$$

In order to remove the influence of these inadequacies, this base phase $\psi$ at the pixel B is to be determined.

The phase angle $\phi$ of the pixel can be determined from the complex value of the pixel B as follows:

$$B = |B| \cdot e^{j\varphi} \Rightarrow e^{j\varphi} = \frac{B}{|B|} \quad (2)$$

The absolute value of B thereby corresponds to the absolute value of the difference of the water signal portion W and the fat signal portion F in the pixel. However, the algebraic sign of this difference is thereby initially unknown, meaning that:

$$(W-F) = \pm|W-F| = \begin{cases} |W-F| \cdot e^{j0} & \text{for } W > F \\ |W-F| \cdot e^{j\pi} & \text{for } W < F \end{cases} \quad (3)$$

$$B = |W-F| \cdot e^{j\Delta} \cdot e^{j\varphi} \text{ with } \begin{array}{l} \Delta = 0 \text{ for } W > F \\ \Delta = \pi \text{ for } W < F \end{array} \quad (4)$$

results for the pixel B, such that finally, for the base phase $\psi$ at the pixel B:

$$\psi = \Delta + \varphi \text{ with } \begin{array}{l} \Delta = 0 \text{ for } W > F \\ \Delta = \pi \text{ for } W < F \end{array} \quad (5)$$

For an arbitrary first pixel, the base phase at this first pixel is then arbitrarily determined in Step 21 according to Equation (5) either at $\phi$ or at $\phi+\pi$. For all additional pixels of the MR image, the base phases at said additional pixels are determined starting from the first pixel and the base phase at the first pixel. Use is made of the fact that the base phase changes only slightly between adjacent pixels. Based on the first pixel and the fact that the base phase changes only slightly between adjacent pixels, base phases at additional pixels are then determined as described in the following.

At least one pixel Y for which the base phase has already been determined is located in the surroundings of a pixel X for which the base phase is to be determined. A phase difference between the phase angle of the pixel X and the base phase of pixel Y is initially determined. If this phase difference is less than 90° (or smaller than $\pi/2$), the base phase $\psi_x$ of the pixel X is most probably equal to the phase angle $\phi_x$ of the pixel X, and the base phase of the pixel X is defined as $\psi_x := \phi x$. By contrast, if the phase difference is greater than 90° (or greater than $\pi/2$), the base phase $\psi_x$ of the pixel C is most probably opposite the phase angle $\phi_x$ of the pixel X, and the base phase of the pixel C is defined as $\psi_x := \phi_x + \pi$.

If the corresponding base phases have already been determined for multiple pixels, in the further course of the method the base phase of a pixel X can be determined in that the phase difference is formed from the difference between the phase angle of the pixel X to be determined and the phase angle of a vector sum of multiple pixels Y in proximity to the pixel X to be determined, the corresponding bases phases of which pixels Y have already been determined. The multiple pixels Y in proximity to the pixel X to be determined can, for example, be multiple pixels from a spatial environment of 5×5×5 or 7×7×7 pixels around the pixel X to be determined. The phase angle of the vector sum results via vector addition of the pixels Y, wherein the base phase previously determined for the respective pixel Y is respectively used as a phase angle of these pixels Y. The base phase of the pixel X is determined based on this phase difference. If the phase difference is less than 90°, the base phase $\phi_x$ at the pixel X is associated with the value of the phase angle $\phi_x$ of the pixel X; if the phase difference is greater than 90°, the base phase $\psi_x$ at the pixel X is associated with the value of the phase angle $\phi_x$ of the pixel X plus 180°. After the base phase has been determined as described in the preceding for the pixel X, the pixel can then be used to determine the base phases of additional pixels, for example as part of a corresponding vector sum.

A base phase can be determined in this manner for every pixel of the MR image with the aid of the previously described region growing method, starting from an arbitrarily estimated base phase value. The base phase so determined (Block 22) is used together with the complex image data of Block 20 in Step 23 to generate an MR image with corrected phase angles (Block 24). The complex image data of the MR image of the block 24 exhibit a phase of either 0° or 180° (or $\pi$) for every pixel. A sub-division of the MR image 24 into an image with water-dominated tissue 26 and an image with fat-dominated tissue 27 is possible using this phase angle (Step 25). However, at this point it is not yet clear whether the pixels with a phase angle of 0° belong to the water-dominated tissue and the pixels with a phase angle of 180° belong to the fat-dominated tissue or vice versa.

A first MR image is therefore initially generated from the original MR image 24 in that the value of the corresponding pixel of the original MR image 24 is associated with every pixel of the first MR image when the phase angle of this pixel in the original MR image is 0°, and otherwise a value of 0 is associated with the pixel of the first MR image. A second MR image is likewise generated from the original MR image by associating either the value of the corresponding pixel of the original MR image 24 with every pixel of the second MR image when the phase angle of the pixel of the original MR image is 180° (or $\pi$), or otherwise the value of 0 is associated.

A first average value of all pixels of the first MR image differing from 0 and a second average value of all pixels of the second MR image differing from 0 are then generated. Since the values of pixels which belong to fat-dominated tissue are generally greater than the values of pixels which belong to water-dominated tissue, by comparison of the two average values it can be determined which of the two MR images represents the image with fat-dominated tissue and which represents the image with water-dominated tissue (Blocks 26 and 27).

Alternatively, it is possible to determine which of the two MR images represents the image with fat-dominated tissue and which represents the image with water-dominated tissue by, for example, using prior anatomical knowledge in order to determine one or more pixels as pixels of a fat-dominated or water-dominated tissue based on the prior anatomical knowledge. By checking whether the pixels so predetermined in the first or second MR image are present as pixels differing from 0, an association of the first and second MR image with water-dominated or fat-dominated tissues can be implemented.

With the method presented herein it is thus possible to differentiate whether a pixel belongs to water-dominated tissue or fat-dominated tissue. Only one complex MR image which was acquired at a point in time at which magnetic resonance signals of an aqueous tissue exhibit a phase opposite phases of magnetic resonance signals of an adipose tissue is thereby necessary. This leads to a substantial reduction of the acquisition time compared with a two-point Dixon method in which two MR images must be acquired, one with opposite phase and one in-phase.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to automatically differentiate whether a pixel of a magnetic resonance image acquired by a magnetic resonance system originated from fat-dominated tissue or water-dominated tissue, comprising the steps of:
    acquiring only one spin echo-based magnetic resonance signal from a patient for each pixel of a magnetic resonance image at a point in time at which a phase of a magnetic resonance signal originating from water tissue in the patient has a phase opposite to a phase of a magnetic resonance signal originating from fat tissue in the patient;
    in a processor,
        automatically calculating a phase angle of the pixel from only the acquired only one spin-echo based magnetic resonance signal;
    in said processor
        automatically determining a base phase at said pixel dependent on said magnetic resonance system; in said processor,
        automatically determining a corrected phase angle of said pixel from the phase angle of the pixel and the base phase at the pixel; and in said processor,
        automatically determining whether said pixel represents fat-dominated tissue or water-dominated tissue using said corrected phase angle of said pixel.

2. A method as claimed in claim 1 comprising, in said processor,
    associating either the value of the phase angle of the pixel or the value of the phase angle of the pixel plus 180° with the base phase at the pixel,
    using the fact that the phase angle of the pixel without the base phase is either substantially 0° or substantially 180°, depending on a water content or a fat content of the tissue represented by the pixel.

3. A method as claimed in claim 1 comprising, in said processor, determining said base phase at said pixel using the fact that a difference between the base phase at the pixel and an additional base phase at an additional pixel in an environment of the pixel is low.

4. A method as claimed in claim 3 comprising determining the base phase at the pixel by:
    determining a phase difference between the phase angle of the pixel and the additional base phase of the additional pixel in the environment of the pixel;
    associating the value of the phase angle of the pixel with the base phase of the pixel when the phase difference is smaller than 90°; and
    associating the value of the phase angle of the pixel plus 180° with the base phase at the pixel when the phase difference is greater than 90°.

5. A method as claimed in claim 3 comprising determining the base phase at the pixel by:
    determining a vector sum of additional pixels in the environment of the pixel for the respective additional base phases that have been determined, and
    forming said vector sum by vector addition of said additional pixels, and
    using the determined additional base phases at the additional pixels for the respective phase angles of the additional pixels;
    determining a phase difference between the phase angle of the pixel and the phase angle of the vector sum; associating the value of the phase angle of the pixel with the base phase at the pixel when the phase difference is smaller than 90°; and
    associating the value of the phase angle of the pixel plus 180° with the base phase at the pixel when the phase difference is greater than 90°.

6. A method as claimed in claim 3 comprising
    determining the base phase at the pixel by: in said processor,
    implementing a region growing algorithm in which either a first region or a second region is associated with every pixel of said magnetic resonance image using the respective phase angles of the pixels; and
    associating the value of the phase angle of the pixel with the base phase when the first region is associated with the pixel, and
    associating the value of the phase angle of the pixel plus 180° with the base phase when the second region is associated with the pixel.

7. A method as claimed in claim 1 comprising determining the corrected phase angle of the pixel by subtracting the base phase at the pixel from the calculated phase angle of the pixel from the calculated phase angle of the pixel.

8. A method as claimed in claim 1 comprising
    determining whether said pixel represents fat-dominated tissue or water-dominated tissue by associating the pixel, using the corrected phase angle of the pixel, with a first tissue type or with a second tissue type, with said first tissue type and said second tissue type being unambiguously associated with fat-dominated tissue and water-dominated tissue, respectively, using properties of the pixels associated with the first tissue type and the second tissue type.

9. A method as claimed in claim 8 comprising respectively associating said first and second tissue types by:
    determining a first average of absolute values of pixels that are associated with said first tissue type;
    determining a second average value of respective absolute values of pixels that are associated with said second tissue type;
    associating the first tissue type with fat-dominated tissue and associating the second tissue type with water-dominated tissue when said first average value is greater than said second average value; and
    associating said first tissue type with water-dominated tissue and associating the second tissue type with fat-dominated tissue when said first average value is less than said second average value.

10. A method as claimed in claim 8 comprising associating the respective first and second tissue types by:
    determining a pixel coordinate of a pixel in said magnetic resonance image that unambiguously represents water-dominated tissue;
    associating the first tissue type with water-dominated tissue and associating the second tissue type with fat-dominated tissue when the pixel at the determined pixel coordinate is associated with the first tissue type; and
    associating the first tissue type with fat-dominated tissue and associating the second tissue type with water-dominated tissue when the pixel at the determined pixel coordinate is associated with the second tissue type.

11. A method as claimed in claim 1 comprising: in said processor,
determining, for each pixel in said magnetic resonance image, whether the pixel represents fat-dominated tissue or water-dominated tissue; and
generating a magnetic resonance image with water-dominated tissue by
associating every pixel in the magnetic resonance image with water-dominated tissue with the absolute value of the pixel when the pixel represents water-dominated tissue, and
associating a value of 0 if the pixel does not represent water-dominated tissue.

12. A method as claimed in claim 1 comprising: in said processor,
determining, for each pixel in said magnetic resonance image, whether the pixel represents fat-dominated tissue or fat-dominated tissue; and
generating a magnetic resonance image with fat-dominated tissue by
associating every pixel in the magnetic resonance image with fat-dominated tissue with the absolute value of the pixel when the pixel represents fat-dominated tissue, and
associating a value of 0 if the pixel does not represent fat-dominated tissue.

13. A magnetic resonance system configured to automatically differentiate whether a pixel of a magnetic resonance image acquired by a magnetic resonance system originated from fat-dominated tissue or water-dominated tissue, comprising:
a magnetic resonance data acquisition unit adapted to interact with a patient;
a control unit configured to operate said magnetic resonance data acquisition unit in order to acquire acquiring only one spin echo-based magnetic resonance signal from the patient for each pixel of a magnetic resonance image at a point in time at which a phase of a magnetic resonance signal originating from water tissue in the patient has a phase opposite to a phase of a magnetic resonance signal originating from fat tissue in the patient;
a processor configured to automatically calculate a phase angle of the pixel from only the acquired only one spin-echo based magnetic resonance signal;
said processor being configured to automatically determine a base phase at said pixel dependent on said magnetic resonance system;
said processor being configured to automatically determine a corrected phase angle of said pixel from the phase angle of the pixel and the base phase at the pixel; and
said processor being configured to automatically determine whether said pixel represents fat-dominated tissue or water-dominated tissue using said corrected phase angle of said pixel.

14. A non-transitory computer-readable storage medium encoded with programming instructions, said storage medium being loadable into a computer system of a magnetic resonance apparatus, and said programming instructions causing said computer system to operate said magnetic resonance apparatus to:
acquire only one spin echo-based magnetic resonance signal for each pixel of a magnetic resonance image at a point in time at which a phase of a magnetic resonance signal originating from water tissue has a phase opposite to a phase of a magnetic resonance signal originating from fat tissue;
automatically calculate a phase angle of the pixel from only the acquired only one spin-echo based magnetic resonance signal;
automatically determine a base phase at said pixel dependent on said magnetic resonance system;
automatically determine a corrected phase angle of said pixel from the phase angle of the pixel and the base phase at the pixel; and automatically determine whether said pixel represents fat-dominated tissue or water-dominated tissue using said corrected phase angle of said pixel, and make a representation of said pixels available at an output of said computer system together with an indication of whether each said pixel represents fat-dominated tissue or water-dominated tissue.

* * * * *